(12) United States Patent
Wang et al.

(10) Patent No.: US 6,984,263 B2
(45) Date of Patent: Jan. 10, 2006

(54) SHALLOW MELT APPARATUS FOR SEMICONTINUOUS CZOCHRALSKI CRYSTAL GROWTH

(75) Inventors: Tihu Wang, Littleton, CO (US); Theodore F. Ciszek, Evergreen, CO (US)

(73) Assignee: Midwest Research Institute, Kansas City, MO (US)

( * ) Notice: Subject to any disclaimer, the term of this patent is extended or adjusted under 35 U.S.C. 154(b) by 9 days.

(21) Appl. No.: 10/494,482

(22) PCT Filed: Nov. 1, 2001

(86) PCT No.: PCT/US01/46211

§ 371 (c)(1),
(2), (4) Date: Apr. 29, 2004

(87) PCT Pub. No.: WO03/038161

PCT Pub. Date: May 8, 2003

(65) Prior Publication Data

US 2004/0200408 A1 Oct. 14, 2004

(51) Int. Cl.
*C30B 35/00* (2006.01)
(52) U.S. Cl. .................. 117/18; 117/213; 117/214; 117/220
(58) Field of Classification Search ............ 117/13, 117/18, 213, 214, 220
See application file for complete search history.

(56) References Cited

U.S. PATENT DOCUMENTS

| 4,203,951 | A | | 5/1980 | Goriletsky et al. | |
|---|---|---|---|---|---|
| 5,034,200 | A | | 7/1991 | Yamashita et al. | |
| 5,126,114 | A | * | 6/1992 | Kamio et al. | 117/213 |
| 5,139,750 | A | * | 8/1992 | Shima et al. | 117/213 |
| 5,143,704 | A | * | 9/1992 | Nakaham et al. | 117/213 |
| 5,312,600 | A | * | 5/1994 | Kamio et al. | 117/213 |
| 5,314,667 | A | * | 5/1994 | Lim et al. | 117/213 |
| 5,720,809 | A | | 2/1998 | Iino et al. | |
| 5,871,581 | A | | 2/1999 | Atami et al. | |
| 5,891,245 | A | | 4/1999 | Atami et al. | |

* cited by examiner

*Primary Examiner*—Felisa Hiteshew
(74) *Attorney, Agent, or Firm*—Paul J. White

(57) ABSTRACT

In a single crystal pulling apparatus for providing a Czochralski crystal growth process, the improvement of a shallow melt crucible (20) to eliminate the necessity supplying a large quantity of feed stock materials that had to be preloaded in a deep crucible to grow a large ingot, comprising a gas tight container a crucible with a deepened periphery (25) to prevent snapping of a shallow melt and reduce turbulent melt convection; source supply means for adding source material to the semiconductor melt; a double barrier (23) to minimize heat transfer between the deepened periphery (25) and the shallow melt in the growth compartment; offset holes (24) in the double barrier (23) to increase melt travel length between the deepened periphery (25) and the shallow growth compartment; and the interface heater/heat sink (22) to control the interface shape and crystal growth rate.

19 Claims, 3 Drawing Sheets

SHALLOW MELT APPARATUS FOR SEMICONTINUOUS CZOCHRALSKI CRYSTAL GROWTH

CONTRACTUAL ORIGIN OF THE INVENTION

The United States Government has rights in this invention pursuant to Contract No. DE-AC36-99GO-10337 between the United States Department of Energy and the Midwest Research Institute.

TECHNICAL FIELD

The present invention relates to growing crystals without encountering the problems normally associated with conventional Czochralski crystal growth of: strong melt convection that causes deteriorated crystal quality, constantly changing thermal conditions; segregation causing non-uniformity in dopant concentrations; a slow growth rate and an uncontrollable interface shape; slow turn around between crystal ingots; and significant loss of feedstock materials if a growth run fails. The invention eliminates the foregoing problems through the use of a shallow melt with a heat shield and an interface heater-heat sink to overcome microdefects, stress management and defect minimization, swift turnaround between crystal ingots, and the saving of feedstock materials through the use of a double barrier that offsets connecting holes for replenishing the melt.

BACKGROUND ART

Affecting crystal growth using the conventional Czochralski (CZ) process has been accomplished utilizing a pulling apparatus employing the CZ technique comprising: A gas type chamber; a crucible for storing a semiconductor melt that is positioned inside the chamber; a heater for heating the semiconductor melt; and a pulling mechanism for pulling a single crystal of the semiconductor. With this apparatus, a seed crystal of the single crystal of the semiconductor is immersed in the semiconductor melt inside the crucible, whereupon the seed crystal is gradually pulled upwards, thereby growing a large diameter single crystal of the semiconductor having the same orientation as the seed crystal.

As the Czochralski method evolved as the prevalent one for the operation of pulling a silicon single crystal, a method of the version adopted a double-wall crucible formed by disposing a cylindrical partition wall in an outer crucible to operate the crucible by supplying solid or fused silicon as a raw material, either batch wise or continuously, into the crucible through a gap between the inner surface of the outer crucible and the outer surface of the cylindrical partition wall and pulling a silicon single crystal from the molten mass of silicon in the cylindrical partition wall.

U.S. Pat. No. 5,871,581 discloses a single crystal pulling apparatus comprising:
  a gas tight container;
  a double crucible for storing a semiconductor melt inside the gas tight container, the double crucible including an outer crucible and an inner crucible connected at a lower edge;
  source material supply means, disposed between the outer crucible and the inner crucible, for continuously adding source material to the semiconductor melt; and
  a flow restriction member, disposed inside the semiconductor melt region between the outer crucible and the inner crucible, for restricting the flow of the semiconductor melt.

A crucible for pulling silicon single crystal is disclosed in U.S. Pat. No. 5,720,809. The crucible is constructed by coaxially disposing a cylindrical partition wall inside an outer crucible for holding a molten mass of silicon as a raw material and operated by heating the outer crucible and meanwhile supplying the raw material silicon to the gap between the outer crucible and the cylindrical partition wall and introducing the consequently produced molten mass of silicon into the interior of the cylindrical partition wall via a passage below the surface of the molten mass interconnecting the outer crucible and the inside of the cylindrical partition wall and meanwhile pulling the single crystal bar from the molten mass of silicon inside the cylindrical partition wall, which double-wall crucible is characterized in that at least the cylindrical partition wall is formed of quartz glass having a hydroxyl group (OH group) content of not more than 30 ppm.

There is a need in the art of crystal growth utilizing the Czochralski method to avoid the problems of: (1) strong melt convection leading to deteriorated crystal quality (high oxygen content when a silica crucible is commonly used, and increased microdefects); 2) constantly changing thermal conditions even with synchronized crucible lift; (3) segregation caused non-uniformity in dopant concentrations; (4) a slow growth rate (productivity) and a generally incontrollable interface shape (for stress management and defect minimization); (5) slow turn around between crystal-ingots; and (6) a significant loss of feedstock materials if a growth run fails.

DISCLOSURE OF THE INVENTION

One object of the present invention is to provide a semicontinuous Czochralski crystal growth from a shallow melt apparatus that overcomes the increase of microdefects during crystal growth.

Another object of the present invention is to provide a semicontinuous Czochralski method of crystal growth from a shallow melt apparatus that lessens stress management and minimizes defects in the crystal growth.

A further object of the present invention is to provide a semicontinuous Czochralski method of crystal growth from a shallow melt apparatus that hastens turn around between crystal ingots.

A yet further object of the present invention is to provide a semicontinuous Czochralski method of crystal growth from a shallow melt apparatus that saves feed stock materials.

Another object yet still of the present invention is to provide a semicontinuous Czochralski method of crystal growth from a shallow melt apparatus that offsets connecting holes for replenishing the melt.

In general, the CZ crystal growth methods of the invention are accomplished by the use of:
  a crucible with a deepened periphery to prevent snapping (i.e., a sudden uncontrollable motion) of a shallow melt to reduce turbulent melt convection;
  a double barrier to isolate heat in the feeding compartment from the growth compartment to melt solid feeding materials and minimize thermal impact to the growing crystal;
  an interface thermal gradient control, wherein a shallow melt in the growth compartment allows for a much better thermal gradient control near the interface; and
  an interface heater or a heat sink under the growth compartment, to obtain a concave or a convex interface shape.

DETAILED DESCRIPTION OF PREFERRED EMBODIMENTS

Figure 1:
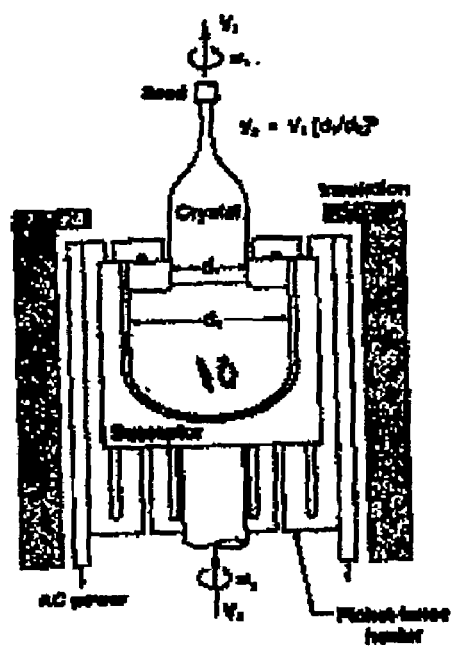
FIG. 1 shows the apparatus (including crucible) for a conventional CZ crystal growth process.

In the semicontinuous Czochralski crystal growth from a shallow melt of the invention, the essential elements of the crucible comprises a crucible with a deepened periphery to prevent snapping of a shallow melt, and has a double barrier to isolate heat in the feeding compartment from that in the growth compartment, and further contains an interface thermal gradient control.

The invention will be better understood and the objects and features thereof apparent by reference to the drawing figures, compared to a conventional CZ crystal growth process utilizing a different crucible construction.

In this connection, reference is now made to FIG. 1 which shows a conventional CZ crystal growth apparatus and a melt crucible 10, as used therein. In this conventional process, a large quantity of feed stock materials must be preloaded in the deep crucible or melt crucible to grow a large ingot. This unfortunately causes problems such as, strong melt convection leading to deteriorated crystal quality (high oxygen content when a silica crucible is used and increased microdefects), constantly changing thermal conditions even with synchronized crucible lift, segregation caused by non-uniformity in the dopant concentrations; a slow growth rate (productivity) and a generally incontrollable interface shape (for stress management and defect minimization), slow turn around between crystal ingots and a significant loss of feed stock materials if a growth run fails.

Figure 2:
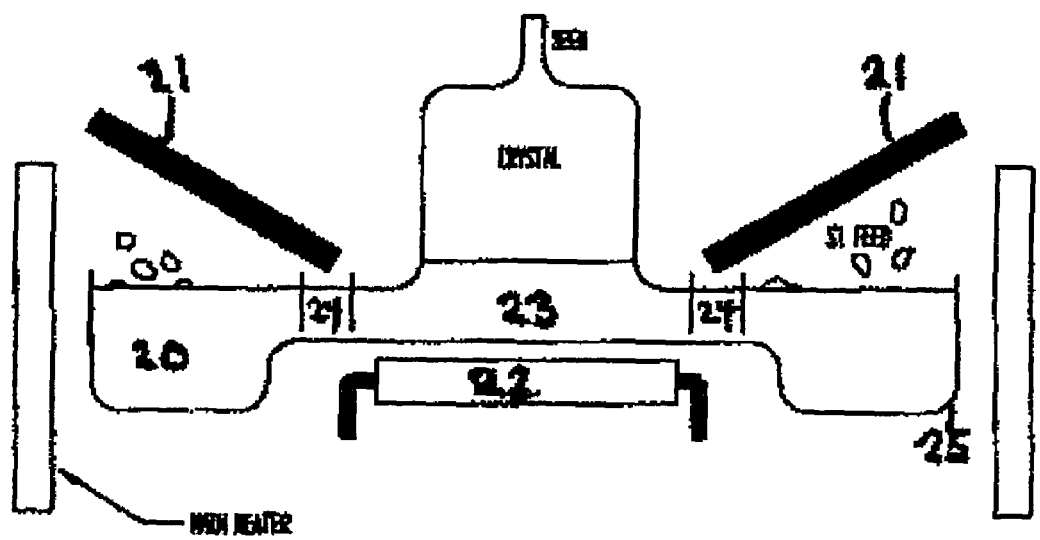
FIG. 2 depicts apparatus of the invention for providing semicontinuous CZ crystal growth from a shallow melt.

On the other hand, and by contrast, semicontinuous CZ crystal growth from a shallow melt of the invention, as depicted in the apparatus of FIG. 2 presents solutions to each of the foregoing problems. As can be seen from FIG. 2, the invention apparatus features a shallow melt crucible 20 (particularly in the region immediately under the crystal/liquid interface) with an insulation or heat shield 21 and an interface heater/heat sink 22, and these features overcome the problems of: strong melt convection leading to deteriorated crystal quality; a slow growth rate and a generally incontrollable interface shape; slow turnaround between crystal ingots and a significant loss of feed stock materials if a growth run fails. The double barrier 23 with off setting connecting holes 24 for replenishing the melt eliminates the problem of constantly changing thermal conditions even with synchronized crucible lift and segregation cost non-uniformity in dopant concentrations. Further, a deepened periphery 25 in the crucible prevents the shallow melt from snapping and additionally acts as a feed compartment.

One aspect of the invention discovery is that a crucible with a deepened periphery prevents snapping of a shallow melt.

A shallow melt is needed to reduce turbulent melt convection. Turbulence is related to the Grashof number:

$$G_r = \frac{g\beta L^3 \Delta T}{v^2} = \frac{\text{buoyancy force}}{\text{viscous force}}$$

Where g is the gravity, β is the thermal expansion coefficient of silicon melt, L is the melt height, ΔT is the vertical temperature difference in the melt, v is the dynamic viscosity of silicon melt.

However a shallow melt tends to ball up. The melt/gas and melt/crucible interface have energy contents proportional to their areas. Therefore, the melt shrinks to minimize energy. The energy per unit area can also be regarded as a surface/interface tension, or force per unit length.

The total free energy of the melt may be defined as follows:

$$E = \Sigma \sigma_i A_i + \int \rho g dz + \int P dV (V = \text{constant}, -z) + P_o + \gamma(1/r_1 + 1/r_2)\cos\theta) \qquad P(z) = \rho g(z_o$$

where $\sigma_i$ is the surface energies (melt/crucible interface and free surface) per unit area, $A_i$ is the area of the surfaces, ρ is the melt density, P is the internal pressure in the melt, z is the vertical coordinate, $z_o$ is vertical reference position, $P_o$ is a reference pressure, γ is the surface tension of the melt, $r_1$ and $r_2$ are the two nominal radii of the melt surface curvature, and θ is the angle between the tangent of the melt edge and the crucible wall on the melt side.

Figure 3:
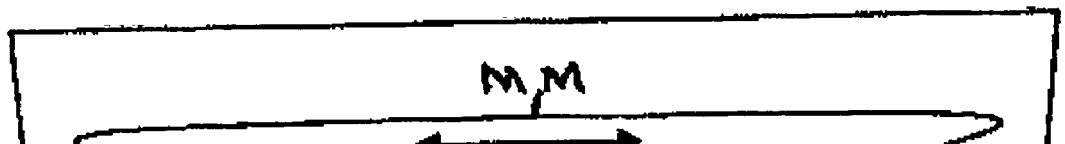
FIG. 3 shows the melt motion where the interface energy is larger than the surface energy (i.e., non-wetting crucible, θ>90 degrees), where the melt will tend to ball-up.

If the interface energy is larger than melt surface energy (i.e., non-wetting crucible, θ>90°, the melt will tend to ball up until the surface/interface area and radius reductions are balanced balanced by gravity potential gains, which will lead to separation of the shallow melt from the side walls of the crucible. This causes an unstable melt, and the melt motion NM is depicted in the direction of the arrows in FIG. 3.

Figure 4:
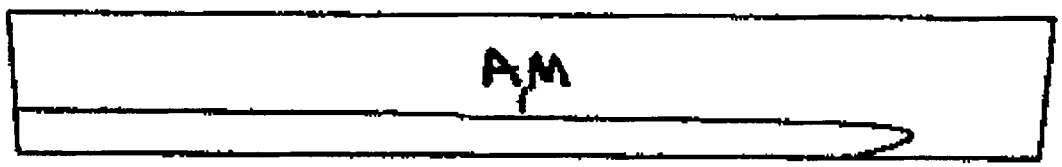
FIG. 4 depicts the asymmetric melt that ensues when both melt surface energy and the interface energy are very high compared to gravity potential energy.

If both melt surface energy and interface energy are very high compared to the gravity potential energy, the melt may retreat from one side and travel to the other side of the crucible, causing undesired asymmetry in the melt shape and temperature distribution. Both situatuations are called melt snapping. The asymmetric melt is depicted in FIG. 4.

Figure 5:
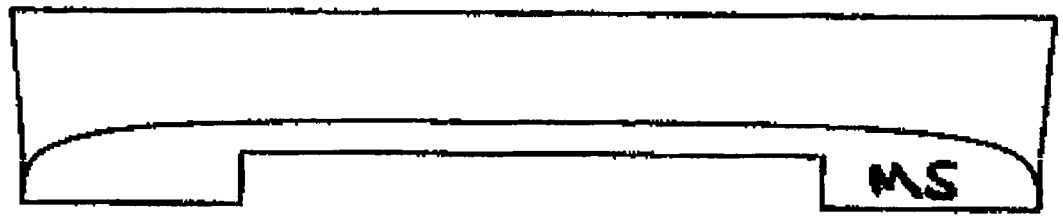
FIG. 5 depicts a melt stabilized from a round or rectangular crucible when a deepened periphery traps the melt around the edge and prevents snapping.

By the use of a crucible design that has a deepened periphery, snapping of melt is prevented even though a shallow melt is still formed in the crystal growth region, as illustrated by the melt stabilized in FIG. 5. Once the melt edge reaches the baseline of the crucible center, any additional melt balling up will be difficult because the gravity potential gain would be greater ($E = \Sigma \sigma_i A_i + \int \rho g dz + \int P dV$).

From FIG. 5, it can be seen that a round or rectangular crucible with a deepened periphery traps the melt around the edge, and thereby prevents snapping.

A double barrier is used to isolate heat in the feeding compartment from that in the growth compartment, and as a result of this configuration, the over heated feed compartment functions to melt solid feeding materials and minimizes thermal impact to the growing crystal.

The heat transfer is comprised of:

Conduction $\propto -k\Delta$-T

Radiation $\propto -\sigma(\epsilon_1 T_1^4 - \epsilon T_2^4)$ and

Melt flow $\propto -C_p\rho(T_1-T_2)V/L$

Where k is the thermal conductivity, T is temperature, $\sigma$ is the Stefan-Boltzmann constant, $\epsilon$ is the emisivity, $C_p$ is the heat capacity of silicon melt, $\rho$ is the silicon melt density, V is the amount of silicon melt being transferred, and L is the length of melt travel.

The double barrier (with offsetting connecting holes) crucible serves to: Reduce $\nabla T$;

Increase L to minimize convective transfer and to eliminate the short path of thermally conductive melt; and Reduce radiative heat transfer with opaque barriers.

Figure 6:
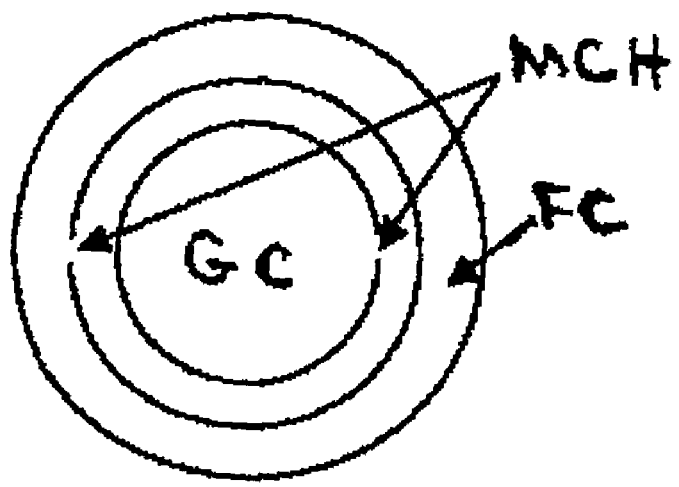
FIG. 6 depicts a top view of the growth department in a round double barrier crucible for semiconductor ingot growth where melt connecting holes are utilized outside of the growth compartment but inside of the feed compartment.

In a primary embodiment of the invention, a round double barrier crucible is utilized for semiconductor ingot growth. A top view of a round double barrier crucible is depicted in FIG. 6, and shows the growth compartment GC, melt connecting holes MCH, and the feed compartment FC.

In another embodiment of the invention, a round double barrier crucible is utilized for semiconductor ingot growth. A top view of a round double barrier crucible is depicted in FIG. 6, and shows the growth compartment GC, melt connecting holes MCH, and the feed compartment FC.

Figure 7:
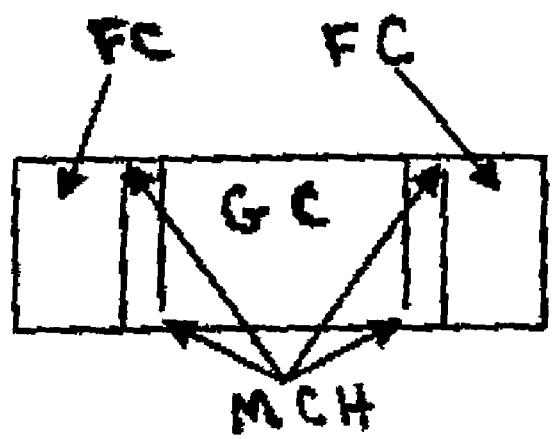
FIG. 7 depicts a side view of a rectangular double-barrier crucible for a sheet or ribbon-shaped crystal growth and shows the melt connecting holes outside of the growth compartment but inside of the feed compartment.

In yet another embodiment of the invention, a rectangular double-barrier crucible is utilized for sheet or ribbon-shaped crystal growth. The rectangular double-barrier crucible is shown in FIG. 7.

Finally, the double barrier crucible of the invention utilizes an interface thermal gradient control in that the shallow melt in the growth compartment operates as a thermal gradient control and allows for a much better thermal gradient control near the interface. By using an interface heater or a heat sink under the growth compartment as shown in FIG. 2, a concave or convex interface shape may be obtained.

In a simplified one dimensional case, the crystal growth rate v is determined by the vertical thermal gradients in the crystal and in the melt near the interface:

$$K_s(dT/dz)_s - K_1(dT/dz)_1 = \text{LatentHeat}*v/\text{Area}$$

Therefore, an increase in the crystal growth rate may be obtained with the combination of a heat shield employed on top of the feeding compartment and an interface heat sink or heater under the growth compartment. The shallow melt allows close proximity between this interface heat sink/heat source and the solid/liquid interface, thus affording easier control of heat transport.

What is claimed is:

1. In a single crystal pulling apparatus for providing a Czochralski crystal growth process, the improvement of a shallow melt crucible having melt connecting holes disposed outside of a growth compartment but inside of a feed compartment to eliminate the necessity of supplying a large quantity of feed stock materials that have to be preloaded in a deep crucible to grow a large ingot, comprising:

a) a gas tight container;
b) a crucible with a deepened periphery to prevent snapping of a shallow melt and reduce turbulent melt convection;
c) semiconductor a double barrier to isolate heat in the feeding compartment from the growth compartment to melt solid feeding materials and minimize thermal impact to the growth crystal;
d) an interface thermal gradient control, from which a shallow melt in the growth compartment allows for better thermal gradient control near an interface; and
e) an interface heater or heat sink under the growth compartment, to provide a concave or convex interface shape.

2. The apparatus of claim 1 wherein said double barrier comprises offsetting pass-through or passage holes to thermally isolate the feed compartment from the growth compartment.

3. The apparatus of claim 2 wherein a heat shield is disposed on top of said feed compartment.

4. The apparatus of claim 3 wherein an interface heater is disposed under said growth compartment.

5. The apparatus of claim 3 wherein said heat sink is disposed under said growth compartment.

6. The apparatus of claim 2 wherein said crucible is rectangular in shape.

7. The apparatus of claim 6 wherein said heat shield is disposed on top of said heat compartment.

8. The apparatus of claim 7 wherein an interface heater is disposed under said growth compartment.

9. The apparatus of claim 7 where a heat sink is disposed under said growth compartment.

10. The apparatus of claim 2 wherein said crucible is round or circular in shape.

11. The apparatus of claim 10 wherein a heat shield is disposed on top of said heat compartment.

12. The apparatus of claim 11 wherein an interface heater is disposed under said growth compartment.

13. The apparatus of claim 11 wherein a heat sink is disposed under said growth compartment.

14. The apparatus of claim 2 wherein said passage holes are near the bottom of said double barrier.

15. The apparatus of claim 14 wherein a heat shield is disposed on top of said feed compartment.

16. The apparatus of claim 15 wherein an interface heater is disposed under said growth compartment.

17. The apparatus of claim 15 wherein a heat sink is disposed under said growth compartment.

18. The apparatus of claim 14 wherein said crucible is rectangular in shape.

19. The apparatus of claim 14 wherein said crucible is round or circular in shape.

* * * * *